US008802483B2

(12) United States Patent
Bent et al.

(10) Patent No.: US 8,802,483 B2
(45) Date of Patent: Aug. 12, 2014

(54) SELF-ORGANIZING NANOSTRUCTURED SOLAR CELLS

(75) Inventors: Stacey F. Bent, Stanford, CA (US); Bruce M. Clemens, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 917 days.

(21) Appl. No.: 12/456,208

(22) Filed: Jun. 11, 2009

(65) Prior Publication Data

US 2009/0314342 A1    Dec. 24, 2009

Related U.S. Application Data

(60) Provisional application No. 61/132,470, filed on Jun. 18, 2008.

(51) Int. Cl.
*H01L 21/00* (2006.01)
*H01L 31/00* (2006.01)

(52) U.S. Cl.
USPC ............................................ 438/74; 136/256

(58) Field of Classification Search
CPC ............ H01L 31/03529; H01L 31/073; H01L 31/1828; Y02E 10/543
USPC ............................................ 136/256; 438/74
See application file for complete search history.

(56) References Cited

U.S. PATENT DOCUMENTS

| | | | |
|---|---|---|---|
| 6,852,920 B2 | 2/2005 | Sager et al. | |
| 8,294,025 B2* | 10/2012 | Fonash et al. | 136/256 |
| 2008/0110494 A1* | 5/2008 | Reddy | 136/255 |
| 2009/0194160 A1* | 8/2009 | Chin et al. | 136/256 |
| 2009/0308442 A1* | 12/2009 | Liu | 136/256 |

OTHER PUBLICATIONS

Tanaka, Kunihiko et al., "Preparation of Cu2ZnSnS4 thin films by sulfurizing sol-gel deposited precursors", May 2007, Solar Energy Materials and Solar Cells 91, pp. 1199-1201.*
Soga, Tetsuo, "Nanostructured Materials for Solar Energy Conversion", 2006, Elsevier B.V., p. 450.*
Wibowo, Rachmat Adhi et al., "Pulsed laser deposition of quaternary Cu2ZnSnSe4 thin films", 2007, Phys. Stat. Sol. (a) 204, No. 10, pp. 3373-3379.*

* cited by examiner

*Primary Examiner* — Tamir Ayad
(74) *Attorney, Agent, or Firm* — Lumen Patent Firm

(57) ABSTRACT

A method of forming a self-organized nanostructured solar cell is provided. The method includes depositing a semiconductor film on a substrate, where the semiconductor film includes a mixture of at least two constituents, then activating the semiconductor film during or after the deposition. Here, the activated semiconductor film self-assembles into an organized nanostructure geometry on the substrate, where the organized nanostructure includes a first structure of the at least one constituent having a first polarity and a second structure of the at least one constituent having a second polarity opposite to the first polarity. Further, the invention includes depositing a contact on a top surface of the organized nanostructure geometry.

10 Claims, 4 Drawing Sheets

SELF-ORGANIZING NANOSTRUCTURED SOLAR CELLS

CROSS-REFERENCE TO RELATED APPLICATIONS

This application is cross-referenced to and claims the benefit from U.S. Provisional Application 61/132,470 filed Jun. 18, 2008, and which are hereby incorporated by reference.

FIELD OF THE INVENTION

The invention relates generally to solar cells. More particularly, the invention relates to a method of providing low cost, nanostructured solar cells having improved efficiency.

BACKGROUND

Present day solar cell technology is regarded as too expensive to be adopted at scales sufficient to significantly reduce greenhouse gas emissions. This situation can be improved by increasing solar cell efficiency and/or by reducing cost. Nanostructured solar cells having improved efficiency have been previously proposed, but such solar cells still tend to be too costly for large-scale applications.

The fundamental technology for solar energy is the photovoltaic (PV) cell, which converts solar radiation into usable electrical energy. Over 90% of today's solar cell production is based on silicon; although silicon-based technology is relatively efficient, the severe requirements on the material crystallinity leads to costs that are currently too high to be adopted for large scale application. Hence there is a pressing need for the development of photovoltaic cells with low cost, high efficiency, and good stability.

One way to achieve low cost cells is by using thin film deposition methods to synthesize solar cell materials and devices. Demonstrated low cost technologies include both solution (e.g. chemical bath deposition, electrodeposition) and vapor (e.g. sputter deposition) methods to grow thin films. However, in thin film photovoltaic technologies, there exists a common problem with conversion efficiency due to poor materials quality: the photogenerated electrons and holes cannot travel very far before recombining at structural defects. Thus the free-carrier diffusion length is typically much shorter than the light penetration depth, so that many photogenerated carriers are lost to recombination before they can reach the device junction and produce power. FIGS. 1(a) and 1(b) show a PV structure 100 and free carrier diffusion length, respectively, that can greatly mitigate the problem by using a nano or microscale heterojunction design with interdigitated semiconductor layers 102/104, thereby obtaining a large light absorption path length 106 (optical thickness) with a short carrier diffusion path 108 to the device junction (see FIG. 1(b)). As shown in the schematic drawing of FIG. 1(a), the solar cell heterostructure design in which the p-n junctions (104/102) are oriented perpendical to the direction of solar flux 110. The interdigitated design separates the critical dimensions for light absorption and the carrier diffusion into orthogonal directions. The design allows highly efficient collection of photogenerated carriers even in poor quality materials by decoupling the length scale of carrier diffusion from that of light absorption. Recently, several investigators have begun to explore this nanostructured geometry in solar cells, mainly with semiconductor nanowires.

Any evaluation of the feasibility of using nanostructured solar cells for true large scale production must include consideration of two important issues: dark current, and the economics of nanostructuring. Studies have shown that the negative effects of short minority-carrier lifetimes, namely high dark current, will be exacerbated by the large increase in junction area that occurs with nanostructuring. Calculations show that the effect can be mitigated by proper choice of materials and by optimizing the length scale for the structure. In choosing a length scale for nanostructuring, a tradeoff must be reached in order to maximize carrier collection without excessively increasing recombination at the interfaces. It is understood that optimal efficiencies will be obtained when the size scale for the nanostructuring is approximately the same as the minority carrier diffusion length. Depending on the material, the tradeoff between carrier collection efficiency and junction area will therefore result in a desirable length scale of order 100's of nm to microns in size.

Forming such nanostructures at low cost, however, is less easily achieved within the currently available repertoire of fabrication methods. In fact, the biggest pitfall to this nanostructuring geometry is that while it may ultimately provide for higher efficiency, the difficulty of making the nanostructures using most currently available methods will drive the cost of the solar cells up, likely negating any increase in efficiency. For example, one technique used in the prior art catalyzed vapor-liquid-solid (VLS) growth of nano- (and micro-) wires. To form ordered array of nanowires, deposition of the catalyst for the VLS growth required photolithographic patterning, deposition, and etch steps, each adding significant expense. Other techniques used for forming nanowires or other nanostructures include colloidal lithography with reactive ion etching, chemical etching of bulk single crystals, and laser ablation. Each of these techniques introduces significant cost to the manufacturing process, detracting from the advantage of nanostructuring.

To overcome this limitation, a method is needed for forming nanostructured solar cells at very low cost, which does not require any of the above elaborate methods. What is needed is a method of taking advantage of natural self-organization as dictated by the phase diagram for the materials of interest.

SUMMARY OF THE INVENTION

To overcome the limitations in the art, the present invention provides a self-organized inorganic nanostructured solar cell. The self-organized inorganic nanostructure solar cell includes a substrate, a top contact and a self-organized inorganic nanostructure layer disposed between the substrate and said top contact. The self-organized inorganic nanostructure layer includes an activated inorganic semiconductor film having at least two constituents that are self-organized as a first structure of at least one constituent having a first polarity and a second structure of at least one constituent having a second polarity opposite to the first polarity.

The invention further includes a method of forming a self-organized inorganic nanostructured solar cell. The method includes depositing a inorganic semiconductor film on a substrate, where the semiconductor film includes a mixture of at least two constituents, then activating the inorganic semiconductor film during or after the deposition. Here, the activated inorganic semiconductor film self-assembles into an organized nanostructure geometry on the substrate, where the organized nanostructure includes a first structure of at least one constituent having a first polarity and a second structure of the at least one constituent having a second polarity opposite to the first polarity. Further, the invention includes depositing a contact on a top surface of the organized nanostructure geometry.

In one aspect of the current invention, the inorganic semiconductor film deposition can include chemical bath deposition, electrodeposition, physical vapor deposition, evaporation, sputter deposition, chemical vapor deposition, or atomic layer deposition.

In another aspect of the invention, the substrate is a transparent electrically conductive substrate. Here, the transparent electrically conductive substrate has a transparency in a range of light wavelength from 300 nm to 1300 nm.

In a further aspect, the two constituent combinations of opposite polarity include a p-type semiconductor and an n-type semiconductor. Here, at least one of the semiconductors has a bandgap in a range of 0.9 eV to 1.6 eV.

In another aspect of the invention, the semiconductor film includes non-toxic earth abundant materials. Here, the non-toxic earth abundant material can include $Cu_2ZnSnS_4$ (CZTS), oxides or other chalcogenides.

According to another aspect, control of the self-assembly can include varying the composition of the semiconductor film, varying a thickness of the semiconductor film, manipulation of temperature, manipulation of deposition chemistry, varying of growth, providing surfactants to control growth locations, patterning nucleation sites or patterning the substrate morphology.

In yet another aspect, the organized nanostructure geometry includes a longer photo absorption length than a photogenerated carrier path, wherein the photo absorption path and said photogenerated carrier path have an aspect ratio in a range of 1-2 to 1-50.

According to a further aspect of the current invention, the semiconductor film has a larger volume fraction than the substrate.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

The current invention provides a method in which nanostructured solar cells can be made with minimal additional processing and cost over that of standard, inexpensive thin film deposition, by taking advantage of natural self-assembling properties to self-organize the inorganic materials into the desired heterostructures. The current invention provides all the advantages of inorganic nanostructured cells (including stability and high efficiency) with the low cost and excellent scaling advantages of currently available thin film technologies.

Figure 2:
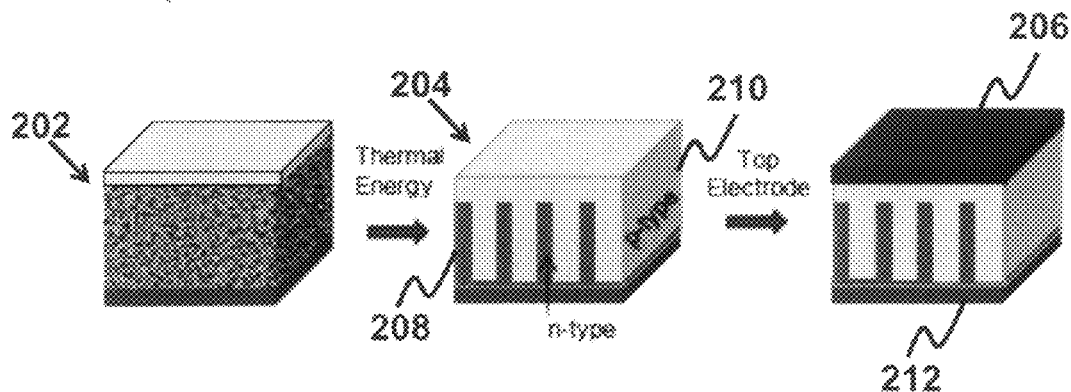
FIG. 2 shows a schematic drawing of one type of self assembly process according to the present invention.

The current invention is a method depositing a thin film of a multicomponent mixture using established deposition routes such as chemical bath deposition, electrodeposition, physical vapor deposition, evaporation, sputter deposition, chemical vapor deposition, or atomic layer deposition. Either during growth, or through a second simple thermal or chemical process, this film is converted to a three-dimensional nanostructure via self-assembly. The self-assembly process 200 involves phase segregation of a metastable, single-phase film into its thermodynamically stable two-phase configuration as is illustrated schematically in FIG. 2. According to the invention, a thin film containing all the elemental components of both desired semiconductors is deposited in one step 202. Then, the film is activated thermally or chemically, generating the nanostructured geometry through natural self-assembly 204. Finally, a top electrode is deposited 206 and the final cell is ready. FIG. 2 shows an exemplary CZTS/ZnS structure, where ZnS (n-type) 208 is shown in gray and CZTS (p-type) 210 in white. The semiconductor film includes non-toxic earth abundant materials such as $Cu_2ZnSnS_4$ (CZTS), oxides or chalcogenides. A transparent conductor 212 is shown on the bottom, having a transparency in a range of light wavelength from 300 nm to 1300 nm, and a contact 206 is shown on the top. The wavelength range depends on the band gap of the semiconductor used in the absorber, since light with a wavelength longer than the wavelength corresponding to the absorber band gap will not produce excited carriers. Alternatively, the nanostructures can be assembled directly during the growth process. According to the current invention, the two constituent combinations of opposite polarity include a p-type semiconductor and an n-type semiconductor. Here, the at least one of the semiconductors has a bandgap in a range of 0.9 eV to 1.6 eV.

The length scale and morphology of this final two-phase configuration can be controlled by varying a thickness of the semiconductor film, manipulation of temperature, manipulation of deposition chemistry, varying of growth, providing surfactants to control growth locations, patterning nucleation sites or patterning the substrate morphology. The final geometry, shown in FIG. 2, is a heterojunction solar cell that provides long absorption lengths with short photogenerated carrier paths in orthogonal directions. If the structure is made at the correct length scale, the photogenerated carrier pathlengths will be smaller than the minority carrier diffusion length, greatly reducing bulk recombination, and significantly increasing the solar cell efficiency for a given optical thickness. We anticipate that the optimal aspect ratios in a range of 1-2 to 1-50, since the typical thickness of direct bandgap solar materials such as CIGS (which defines the height of the structure) is ~1-2 μm, and the desirable lateral length scale based on the minority carrier diffusion length is on the order of 0.1-1 μm. Moreover, the simplest geometry is one in which one of the phases is contained in columnar or lamellar structures embedded in the other phase, although less symmetric geometries would also work. These high symmetry structures are ones that form naturally through the self-assembly process. To maximize optical absorption, the absorber material should have a larger volume fraction than the window material. This helps maximize the aerial density of absorber and also mitigate effects of solar irradiation at off-axis orientations. These dimensions and structures are readily obtainable through the fabrication process according to the current invention.

In order to form solar cells by the method of the current invention, a material must be chosen that will naturally phase segregate into two semiconductors of opposite polarity that have appropriate band properties.

The appropriate material requires the following properties:
1. A multicomponent, metastable "parent" system, such as ABC (where A, B, and C represent elemental or molecular constituents);
2. Thermodynamic phase segregation into two "daughter" materials, which are semiconductors of opposite polarity (n and p), e.g AB and AC;
3. At least one of the "daughter" semiconductors with a proper bandgap for solar absorption.
4. Propensity for guided self-assembly into columnar or laminar structures;
5. Good lattice matching between AB and AC to optimize the interfacial properties.

Figure 3:
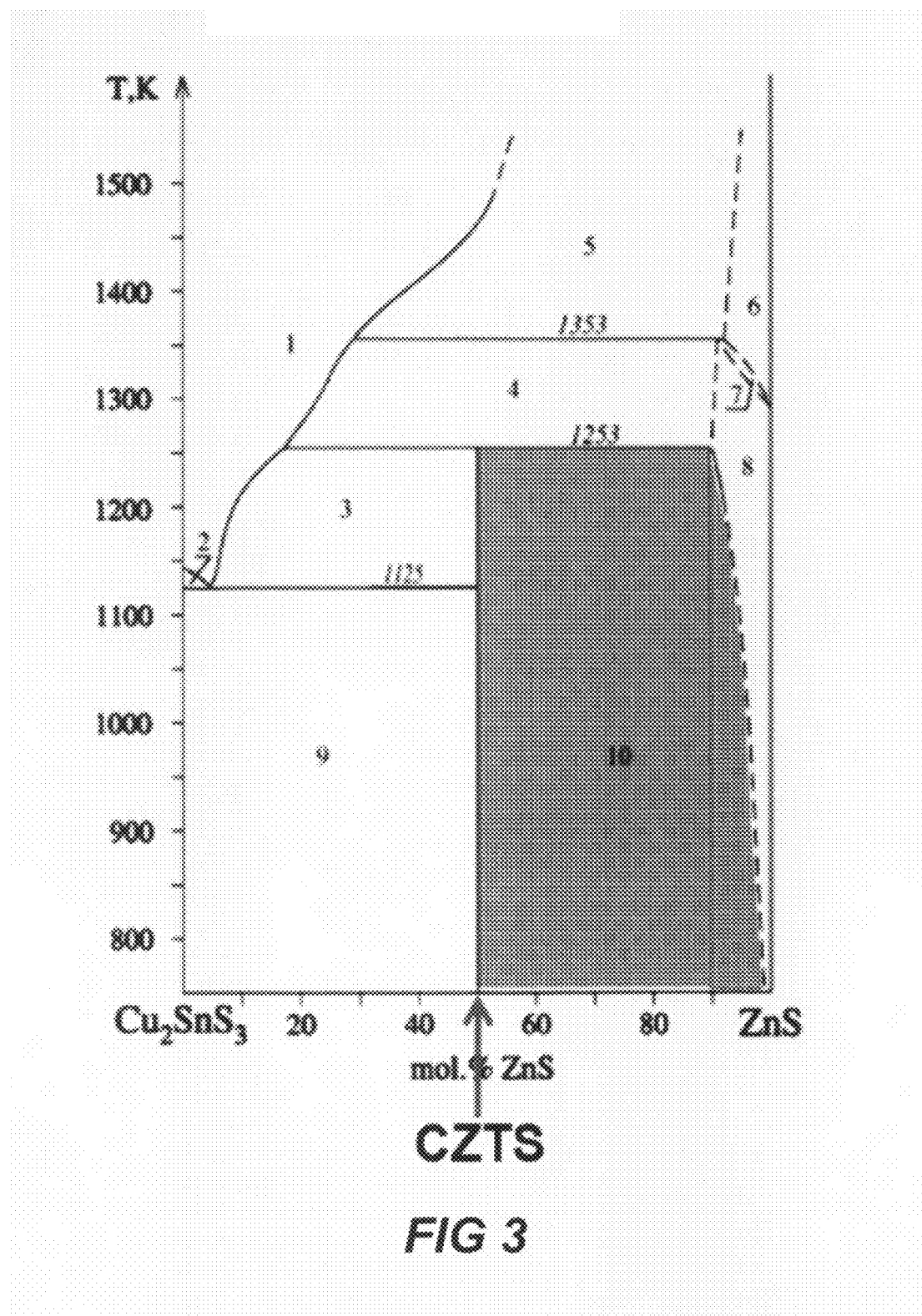
FIG. 3 shows a phase diagram of the $Cu_2SnS_3$—ZnS system.
Figure 4:
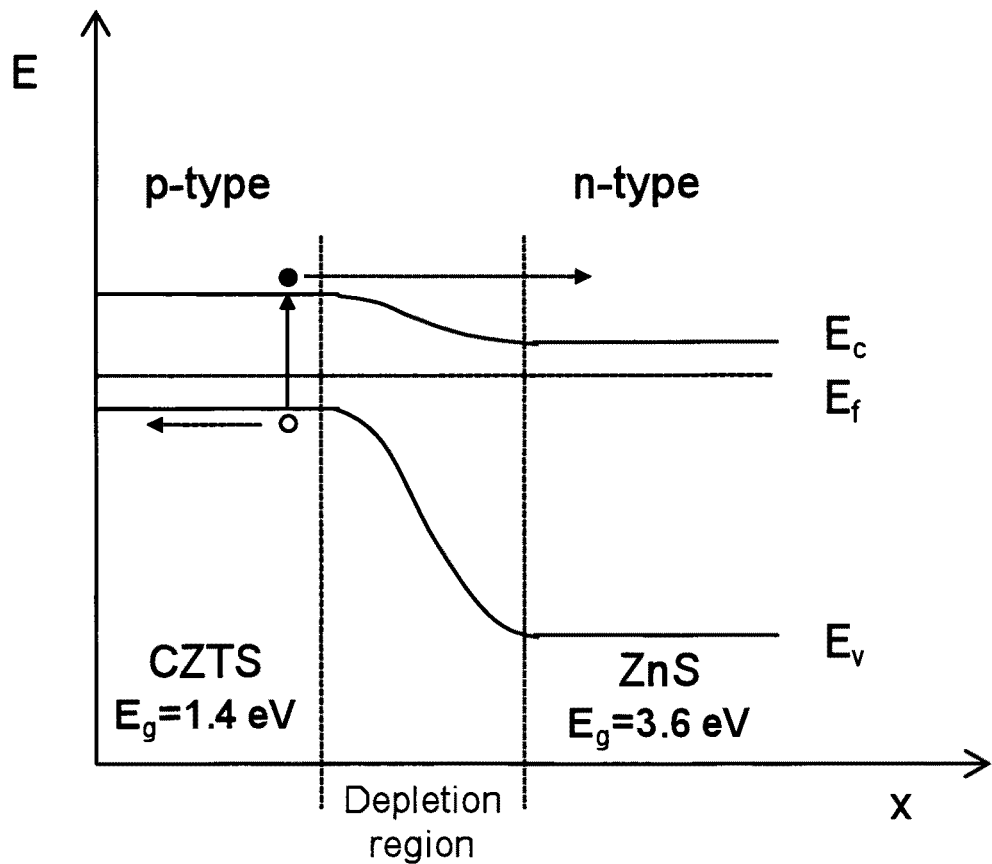
FIG. 4 shows the approximate band diagrams for the CZTS-ZnS solar cell junction.

According to the invention the "parent" includes non-toxic, earth abundant materials, such as $Cu_2ZnSnS_4$ (CZTS). CZTS has a bandgap of 1.4-1.5 eV. It is also a material that is comprised of abundant, non-toxic elements that has potential application in conventional thin film as well as nanostructured photovoltaic systems. CZTS is closely related to $Cu_2InGaSe_4$ (CIGS) but without the rare and toxic In and Se. It is known that CZTS-based solar cells possess an efficiency of nearly 6% in material with a high degree of disorder. According to the phase diagram for CZTS FIG. 3, Zn-rich solutions (crosshatched region 10) will segregate into two semiconductors: CZTS and ZnS. CZTS is naturally p-type, and ZnS is naturally n-type, hence ZnS will act as the opposite polarity semiconductor (i.e. "window" layer). In fact, ZnS is currently being used as the counter semiconductor for some CIGS cells. FIG. 4 shows the approximate band diagrams for the CZTS-ZnS heterojunction.

In addition to this electronic and phase behavior, the interfaces formed in this system are particularly favorable. Although there is a crystal symmetry difference between ZnS, which has the cubic zinc blended structure with a lattice parameter of 5.41 Å, and $Cu_2ZnSnS_4$, which has the tetragonal kesterite crystal structure with lattice parameters of 5.44 Å and 10.88 Å, the two structures have a great deal of similarity in the underlying atomic spacing and structure. In fact, one way of viewing the tetragonal $Cu_2ZnSnS_4$ unit cell is as two ZnS cells with some of the Zn replaced by Cu and Sn. The lattice parameters are nearly a perfect match (only 0.5% mismatch), so the sulfur and metal atom positions are the same for the two structures. This structural similarity is ideal for forming coherent, hetero-epitaxial interfaces between these two phases. This structural perfection and chemical similarity minimizes interfacial recombination and hence increases the efficiency of the device. It is understood that many other multicomponent systems have the desired properties outlined above and are within the scope of the current invention.

The multicomponent parent films, including CZTS, can be deposited different low cost methods: sputter deposition and chemical bath deposition (CBD), for example. These methods can both be used to deposit many different materials; CZTS/ZnS is provided as an example to illustrate these methods to deposit solar cells materials. Moreover, the anisotropic nature of these deposition methods provides for a means to control the self-organization of the solar cells via phase separation.

Figure 5:
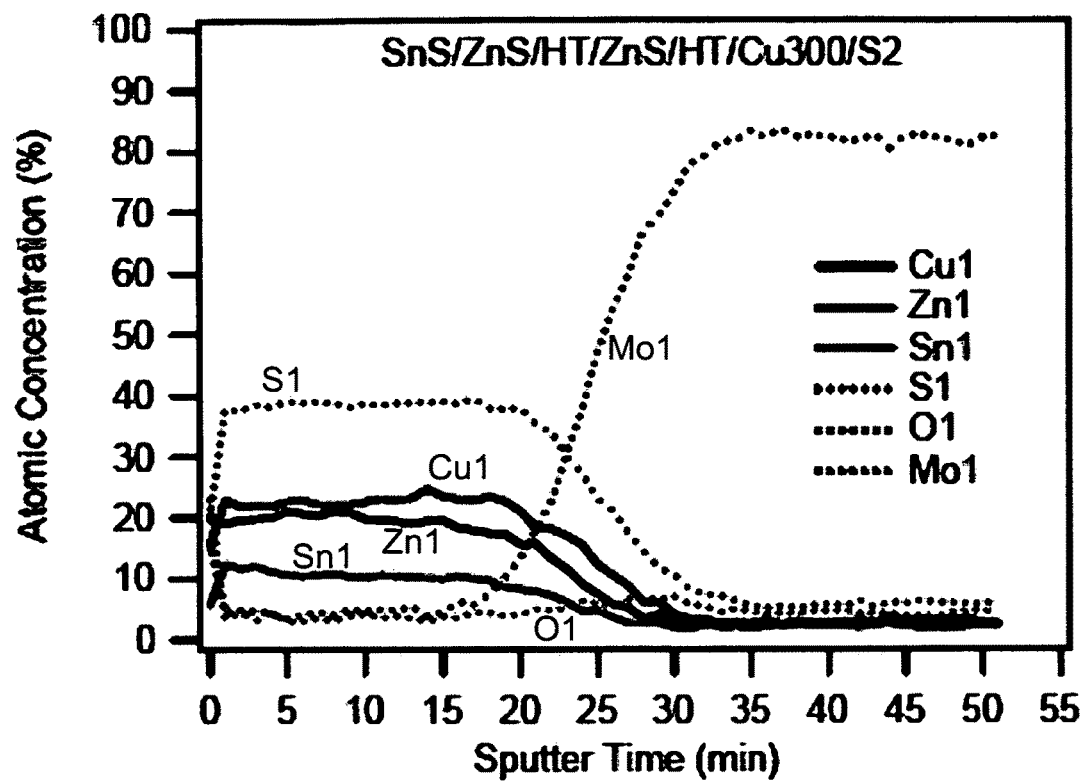
FIG. 5 shows the result of CBD of CZTS onto Mo-coated glass using a combination of the stack design plus ion exchange according to the present invention.

CBD is a solution-based deposition technique used for economical growth of thin films on a variety of substrates. The method is applicable for many different materials, including oxides and sulfides. It is a well-established technique used commercially for growth of CdS films in both CIGS and CdTe photovoltaic modules. In the case of CZTS the invention involves the growth of films from a solution comprised of metal salts, sulfur-containing chemicals (e.g. thiourea), and various complexing agents. A three-layer stack design, incorporating discrete $Cu_2S$, ZnS, and SnS layers, is one embodiment of a method toward CZTS deposition. In addition, an approach based on ion exchange is within the scope of the invention. In one embodiment of this method, a single layer of ZnS is deposited by CBD, and subsequent exposure to concentrated solutions containing $Sn^{2+}$ and $Cu^{2+}$ ions, both of which have higher standard reduction potentials than $Zn^{2+}$, yields incorporation of these ions into the semiconducting film via ion exchange. After deposition of the precursor layers, sulfidation anneals at roughly 400-600° C. are performed in a hydrogen sulfide environment to convert the layers into polycrystalline $Cu_2ZnSnS_4$ films. The result of CBD of CZTS onto Mo-coated glass using a combination of the stack design plus ion exchange is shown in FIG. 5 for a Zn-rich sample. The XPS depth profile measurement clearly shows a uniform profile of the copper, zinc, tin and sulfur elements. The atomic concentrations show excess Zn above the expected stoichiometry for pure CZTS. The concentrations of the different components can be controlled by varying the film thicknesses and ion exchange times. Based on these results CZTS/ZnS materials, as well as other interesting systems, can be deposited using the CBD approach.

For the purposes of description of the growth process, the above examples of ZnS for the n-type layer and $Cu_2ZnSnS_4$ for the p-type (absorber) layer are provided, however it is understood that the basic process can be applied to a wide range of material systems and are within the scope of the invention. For growth of sulfide layers reactive sputter deposition can also be used, incorporating $H_2S$ gas as the sulfur source, and use of temperature, chemical and composition control to form the desired phase in-situ during growth. For example, by adjusting the $H_2S$ composition in the sputter process gas we can tune the chemical potential of the sulfur to drive the sulfide phase formation. Since the desired phase is formed by surface reaction of a plasma-activated species, rather than reaction of a stable molecule and bulk diffusion, the desired phase at temperatures are formed substantially below those used in forming it by the conventional post-deposition processing.

By using separate deposition sources for each of the metal elements the composition of the sputter flux can be tuned during growth to produce the desired composition profile. For example, to produce the tri-layer structure shown in FIG. 2 (a two phase region of ZnS—$Cu_2ZnSnS_4$ terminated by single phase ZnS or $Cu_2ZnSnS_4$ at either end), the process begins by depositing Zn in the presence of $H_2S$ to form the ZnS underlayer. Upon completion of this layer Zn, Cu and Sn are co-deposited in a Zn-rich ratio to place the average composition in the two-phase region of the phase diagram (FIG. 3). For example, to produce a volume fraction f of ZnS in a two-phase mixture of ZnS and $Cu_2SnZnS_4$, the Cu, Zn and Sn sources will be tuned to produce a sputter flux concentration of $Cu_{2(1-f)}Zn_{1+3f}Sn_{1-f}$, which together with the appropriate $H_2S$ pressure will produce the desired phase fraction. (Note this assumes that the sticking coefficients of the metal species are all equal; actual sputter flux concentrations can be adjusted to account for actual sticking coefficients.) Following deposition of the two-phase region, the deposition rate of the Zn source is reduced by a factor of $(1-f)/(1+3f)$, resulting in a sputter flux with the composition appropriate for forming the top layer of $Cu_2ZnSnS_4$.

The current invention can utilize either cylindrical or lamellar microstructures, in which the orientation of the cylinders and lamellae must be controlled. Consequently, the invention provides a guided self-organization process. One aspect of the invention controls nucleation and growth during the 2-phase separation process to produce interconnected phase distributions, with no electrically isolated regions. This control is achieved through a number of different approaches, e.g. through control of the growth process, by deposition of heterogeneous nucleation patterns, or by the use of a surfactant to control the location of growth (for example with patterned, metal-induced crystallization).

Figure 1:
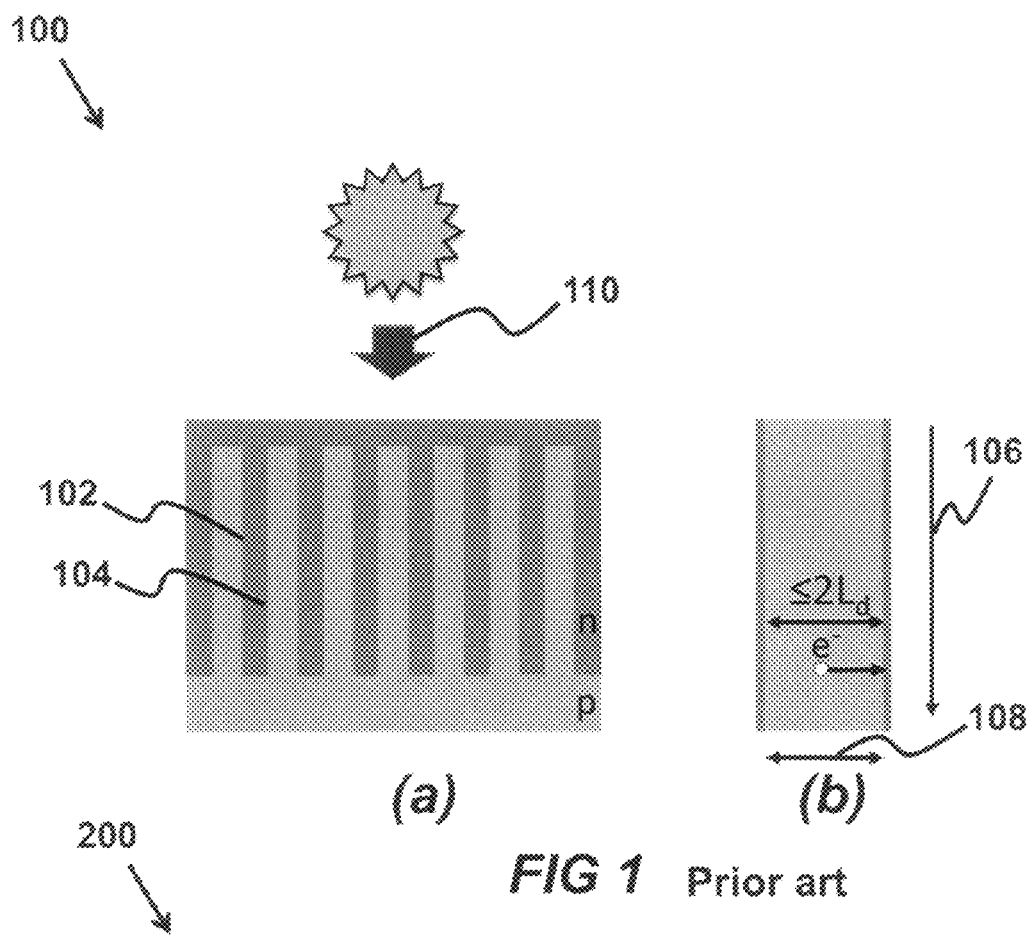
FIGS. 1(a)-1(b) show a PV structure 100 and free carrier diffusion length, respectively.

According to the current invention, the microstructure, as shown in FIG. 1, contains both n-type (e.g. ZnS) and p-type (e.g. $Cu_2ZnSnS_4$) semiconductors, arranged with a two-phase region with vertically oriented phase boundaries sandwiched between cap and base layers of the single phase p- and n-type materials. As discussed above, this microstructure can present a large thickness of absorber layer to the solar flux while minimizing the distance that excited carriers need to diffuse to the p-n interface. The invention forms this microstructure by a rapid, inexpensive, self-assembly process that takes advantage of the chemical control of deposition and natural process that occur during thin film growth.

One aspect of the invention is growth-controlled phase segregation. In order to allow collection of photo-excited carriers, the two-phase region must be comprised of vertically-connected, interdigitated regions of the two phases. This morphology can result from the inherent anisotropy of the growth process, which results in lateral phase segregation due to surface diffusion of the depositing species during growth. If the deposition flux has an average composition corresponding to a two-phase region, there will be a driving force for composition segregation. For a given concentration, the microstructure that develops during growth will be the result of an interplay between the surface diffusivity, $D_s$, and the growth rate v. A characteristic length scale can develop, related to the length $\lambda=(\delta D_s/v)^{1/2}$, where $\delta$ is the surface layer thickness (typically assumed to be about the thickness of one monolayer). Hence by controlling the temperature (and hence $D_s$) and the growth rate v, the length scale of the phase segregation can be controlled. Since the diffusivity on the surface is usually much greater than that that in the bulk, compositional rearrangement can occur during growth at much lower temperatures than in post annealing treatments. The morphology can be further controlled by composition, which determines the volume fractions of the phases in the final configuration. When one of the phases is a clear majority (for example $Cu_2ZnSnS_4$) then the second phase (e.g. ZnS) will form as isolated columns embedded in the majority phase. For more equal volume fractions, the morphology consists of vertical lamella.

According to another aspect of the invention, a variation on this approach is phase segregation induced by the sulfide chemical treatment. In the chemical bath approach, the metal constituents are deposited, either in a monolithic alloy film or as layers, prior to a sulfidation anneal at moderate temperatures. Here the anisotropy of the sulfidation reaction is relied on to impose the lateral phase segregation needed to achieve the vertically-connected, interdigitated morphology. For a film with the correct metal ratios, reaction of sulfur with the film surface will produce a sulfide alloy composition in the two-phase region of the phase diagram. Given sufficient cation mobility, this surface region will rearrange into the two equilibrium crystalline sulfide phases. As the sulfur reaction proceeds deeper into the film, subsequent growth of the two sulfide phases will occur epitaxially on the seeds formed in the surface layer, producing the vertically-connected morphology. Hence the length scale of the phase separation is determined by the kinetics of the surface segregation process.

Another aspect of the invention is templated phase segregation. For example, the nucleation of one or both of the desired phases can be seeded with compositionally enriched regions of the desired length scale and morphology (i.e. platelets or cylinders). One way to achieve this is by pre-depositing a pattern of one of the materials onto the surface, e.g. by microcontact printing. For example, copper particles (e.g. as $Cu_2S$) could be transferred to the surface in a regular pattern prior to deposition of the Zn-rich Cu—Zn—Sn-sulfide film, to generate Cu-rich regions from which to nucleate $Cu_2ZnSnS_4$. This templating approach can easily achieve the ~1 µm length scale required for optimum device design and can be extended to new material systems as our project proceeds. The three-layer structure can be formed by pre and post deposition of the underlayer and overlayer of the two different phases.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of forming a self-organized nanostructured solar cell comprising:
   a. depositing a semiconductor film on a substrate, wherein said semiconductor film comprises a mixture of at least two constituents;
   b. controlling a deposition flux of said semiconductor mixture, wherein said deposition flux comprises an average composition corresponding to a two-phase region within said semiconductor mixture, wherein said deposition flux drives a growth-controlled phase segregation of said semiconductor mixture;
   c. activating said semiconductor film during or after said deposition using thermal or chemical activation, wherein said activated semiconductor film self-assembles according to an inherent anisotropy of said growth-controlled phase segregation into an organized nanostructure geometry comprising an interdigitated and vertically-connected region of said two phase region on said substrate, wherein said interdigitated and vertically-connected region comprises a first structure of said at least one constituent having a first polarity and a second structure of said at least one constituent having a second polarity opposite to said first polarity, wherein said first polarity and said second polarity form a p-n junction of a nanostructured solar cell; and
   d. depositing a contact on a top surface of said organized nanostructure geometry.

2. The method of claim 1, wherein said semiconductor film deposition is selected from the group consisting of chemical bath deposition, electrodeposition, deposition from a liquid solution, physical vapor deposition, evaporation, sputter deposition, chemical vapor deposition, and atomic layer deposition.

3. The method of claim 1, wherein said substrate is a transparent electrically conductive substrate.

4. The method of claim 3, wherein said transparent electrically conductive substrate has a transparency in a range of light wavelength from 300 nm to 1300 nm.

5. The method of claim 1, wherein said two constituent combinations of opposite polarity comprise a p-type semiconductor and an n-type semiconductor.

6. The method of claim 5, wherein at least one of said semiconductors comprises a bandgap in a range of 0.9 eV to 1.6 eV.

7. The method of claim 1, wherein said semiconductor film comprises non-toxic earth abundant materials.

8. The method of claim 7, wherein said non-toxic earth abundant material is selected from the group consisting of $Cu_2ZnSnS_4$ (CZTS), oxides and chalcogenides.

9. The method of claim 1, wherein control of said self-assembly is selected from the group consisting of varying the composition of said semiconductor film, varying a thickness of said semiconductor film, manipulation of temperature, manipulation of deposition chemistry, varying of growth, providing surfactants to control growth locations, patterning nucleation sites and patterning the substrate morphology.

10. The method of claim 1, wherein said organized nanostructure geometry comprises a longer photo absorption length than a photogenerated carrier path, wherein said photo absorption path and said photogenerated carrier path have an aspect ratio in a range of 1-2 to 1-50.

* * * * *